(12) United States Patent
Zhang et al.

(10) Patent No.: US 11,099,133 B2
(45) Date of Patent: Aug. 24, 2021

(54) FLEXIBLE PAPER-BASED SURFACE-ENHANCED RAMAN SCATTERING SUBSTRATE AND METHOD FOR PREPARING SAME

(71) Applicant: Tsinghua University, Beijing (CN)

(72) Inventors: Zhengjun Zhang, Beijing (CN); Fengtong Zhao, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 16/798,345

(22) Filed: Feb. 22, 2020

(65) Prior Publication Data
US 2020/0400579 A1 Dec. 24, 2020

(30) Foreign Application Priority Data
Jun. 19, 2019 (CN) .......................... 201910531577.8

(51) Int. Cl.
| | | |
|---|---|---|
| *G01J 3/44* | (2006.01) | |
| *G01N 21/65* | (2006.01) | |
| *C23C 14/18* | (2006.01) | |
| *C23C 14/28* | (2006.01) | |
| *C23C 14/50* | (2006.01) | |
| *G01N 21/01* | (2006.01) | |
| *H01J 37/305* | (2006.01) | |

(52) U.S. Cl.
CPC ............ *G01N 21/658* (2013.01); *C23C 14/18* (2013.01); *C23C 14/28* (2013.01); *C23C 14/505* (2013.01); *G01N 21/01* (2013.01); *H01J 37/3053* (2013.01)

(58) Field of Classification Search
CPC .................. G01N 21/65; G01N 21/658; G01N 2021/656; G01J 3/44; G01J 3/02

USPC ......................................................... 356/301
See application file for complete search history.

(56) References Cited

U.S. PATENT DOCUMENTS

| | | | |
|---|---|---|---|
| 2007/0166539 A1* | 7/2007 | Zhao | C23C 14/505 428/375 |
| 2008/0044148 A1* | 2/2008 | Robinson | G02F 1/3615 385/122 |
| 2010/0040859 A1* | 2/2010 | Chang | H01L 31/022475 428/304.4 |
| 2015/0321162 A1* | 11/2015 | Brodoceanu | C23C 14/024 506/22 |
| 2016/0218357 A1* | 7/2016 | Yoshikawa | H01M 4/386 |

(Continued)

FOREIGN PATENT DOCUMENTS

| | | | |
|---|---|---|---|
| CN | 102628809 A | * | 8/2012 |
| CN | 106436027 A | | 2/2017 |
| CN | 106770171 A | | 5/2017 |

*Primary Examiner* — Md M Rahman

(57) ABSTRACT

Disclosed are a flexible paper-based surface-enhanced Raman scattering (SERS) substrate and a method of preparing the same, which relate to detection of trace organics. This invention deposits a film of silver nanoparticles on a carrier such as filter paper by oblique-angle deposition to prepare the SERS substrate, which can be used for the detection of trace organics. Silver nanoparticles are closely arranged on the flexible paper, allowing the substrate for good SERS effect due to the interparticle coupling effect. Moreover, compared to the traditional rigid and brittle substrates, the substrate prepared herein can be readily used in the detection of residual organics on complex surfaces in various liquid or solid conditions by dipping, dropwise adding or wiping due to the use of a flexible and absorbent carrier.

2 Claims, 2 Drawing Sheets

(56) References Cited

U.S. PATENT DOCUMENTS

2017/0233896 A1\* 8/2017 Beran ................. D01F 1/10
                                                425/174.8 E
2019/0177916 A1\* 6/2019 Mizukami ............ C08K 3/10

\* cited by examiner

[...]

FLEXIBLE PAPER-BASED SURFACE-ENHANCED RAMAN SCATTERING SUBSTRATE AND METHOD FOR PREPARING SAME

CROSS-REFERENCE TO RELATED APPLICATIONS

This application claims the benefit of priority from Chinese Patent Application No. 201910531577.8, filed on Jun. 19, 2019. The content of the aforementioned application, including any intervening amendments thereto, is incorporated herein by reference in its entirety.

TECHNICAL FIELD

The application relates to detection of trace organics, and more particularly to a flexible paper-based surface-enhanced Raman scattering substrate and a method of preparing the same.

BACKGROUND OF THE INVENTION

Surface-enhanced Raman scattering (SERS), due to advantages of high sensitivity, short time consumption, low cost and no destruction, has been widely used in the detection of trace amounts of chemical and biological molecules. However, since the Raman scattering signal generated from the interaction of light with matter is much weaker than Rayleigh scattering signal, the existing Raman scattering signal detection generally employs noble metal nanostructures, such as nano-Au, nano-Ag and nano-Cu nanostructures, as a highly-sensitive SERS substrate to acquire fingerprint information of the subject. The conventional noble metal nanostructures are commonly supported on a rigid substrate such as silicon wafer or glass, which causes many inconveniences in substrate storage and detection of residues on complex curved surfaces, limiting the application of the SERS technique.

Flexible materials have been increasingly applied in various fields, especially electrical sensing. As a typical flexible material, fiber material has advantages of good deformability, easy storage and strong adsorption, so the combination of fiber material with noble metal nanostructures can effectively broaden the application field of the SERS technique. Silver nanoparticles can be rapidly deposited on fiber paper by electron beam evaporation oblique-angle deposition while rotating the paper substrate. The silver nanoparticles deposited as above have uniform distribution and good adhesion to the fiber substrate, allowing for an excellent SERS effect. Moreover, due to the flexibility of the substrate, the SERS technique becomes suitable for the rapid detection of residues on complex curved surfaces and the rapid sampling and determination of a liquid sample via adsorption, having a broad application prospect.

SUMMARY OF THE INVENTION

An object of the invention is to provide a flexible paper-based surface-enhanced Raman scattering (SERS) substrate and a method of preparing the same using electron beam evaporation oblique-angle deposition.

The technical solutions of the invention are described as follows.

In a first aspect, the invention provides a flexible paper-based SERS substrate, comprising:
a layer of silver nanoparticles; and
a fiber paper;
wherein the layer of silver nanoparticles is deposited on and tightly bound to the fiber paper by electron beam evaporation oblique-angle deposition; the combination of flexible fiber paper with silver which has good SERS effect can broaden the application of the SERS technique, for example, the rapid detection of residues on complex curved surfaces.

The fiber paper is filter paper, absorbent paper or printing paper. The layer of silver nanoparticles is deposited on the fiber paper by electron beam evaporation oblique-angle deposition while rotating the fiber paper to produce the flexible SERS substrate. Due to the use of a flexible and absorbent fiber paper and silver nanoparticles having SERS effect, the flexible SERS substrate prepared herein can be applied in the rapid detection, sampling and determination of residual organics on complex surfaces in various liquid or solid conditions.

The layer of silver nanoparticles, which provides good SERS effect, is deposited on the fiber paper with a thickness according to a crystal oscillator parameter of 500-1,300 nm.

In a second aspect, the invention provides a method of preparing the flexible paper-based SERS substrate, comprising:
depositing silver on the fiber paper by electron beam evaporation oblique-angle deposition while rotating the fiber paper to produce the flexible paper-based SERS substrate, where the SERS substrate prepared herein is easy-to-use and has a wide range of applications.

The method further comprises:
fixing the fiber paper flatly on a holder of an electron beam evaporation deposition system at room temperature;
using the silver as target material, and vacuumizing a reaction chamber of the electron beam evaporation deposition system to $3 \times 10^{-5}$–$3 \times 10^{-4}$ Pa;
adjusting an angle between a normal direction of the holder and an incident direction of an evaporated beam to 85-88°; and rotating the fiber paper at 2-10 rpm; and
depositing the layer of silver nanoparticles on the fiber paper, wherein the layer of silver nanoparticles has a thickness corresponding to a crystal oscillator parameter of 500-1,300 nm. The fiber paper is filter paper, absorbent paper or printing paper. The fiber paper rotates so that the silver nanoparticles can be uniformly deposited on the fiber paper which has a rugged surface in the micro-level.

Compared to the prior art, the invention has the following beneficial effects.

(1) The layer of silver nanoparticles is deposited on the flexible paper by electron beam evaporation oblique-angle deposition to produce the flexible paper-based SERS substrate. The substrate prepared herein has advantages of easy use and good SERS effect, having a wide range of applications.

(2) The silver nanoparticles are closely arranged on the flexible paper, allowing the substrate for good SERS effect due to the interparticle coupling effect.

(3) Due to the use of a flexible and absorbent carrier, the flexible SERS substrate prepared herein can be readily used in the rapid detection of residual organics on complex surfaces in various liquid or solid conditions.

(4) Compared to the traditional rigid and brittle substrates, the SERS substrate prepared herein can be conveniently used in the detection by dipping, dropwise adding or wiping due to the use of a flexible and absorbent carrier.

(5) The flexible SERS substrate prepared herein involves simple preparation, low cost, convenient storage and wide application, which facilitates the commercialization and industrialization, having a brilliant application prospect.

(6) Due to the good SERS effect and broad applicability, the flexible SERS substrate of the invention is suitable for the rapid detection of trace organics in complex situations.

DETAILED DESCRIPTION OF EMBODIMENTS

This invention prepares a flexible surface-enhanced Raman scattering (SERS) substrate by depositing silver nanoparticles on a fiber paper through electron beam evaporation oblique-angle deposition, where the silver nanoparticles are arranged closely, allowing for excellent SERS performance. Thus, the flexible SERS substrate can be applied in the detection of trace organics. Moreover, due to the introduction of a flexible fiber paper which has good adsorption to liquid, the SERS substrate can be conveniently used in the detection of trace organics in liquids by dipping compared to the rigid SERS substrate. The residual liquids and solids on complex curved surfaces can also be rapidly detected and analyzed after wiped with the flexible SERS substrate.

The invention will be further described below with reference to the accompanying drawings and embodiments. These embodiments are illustrative of the invention and are not intended to limit the invention.

Figure 1A:
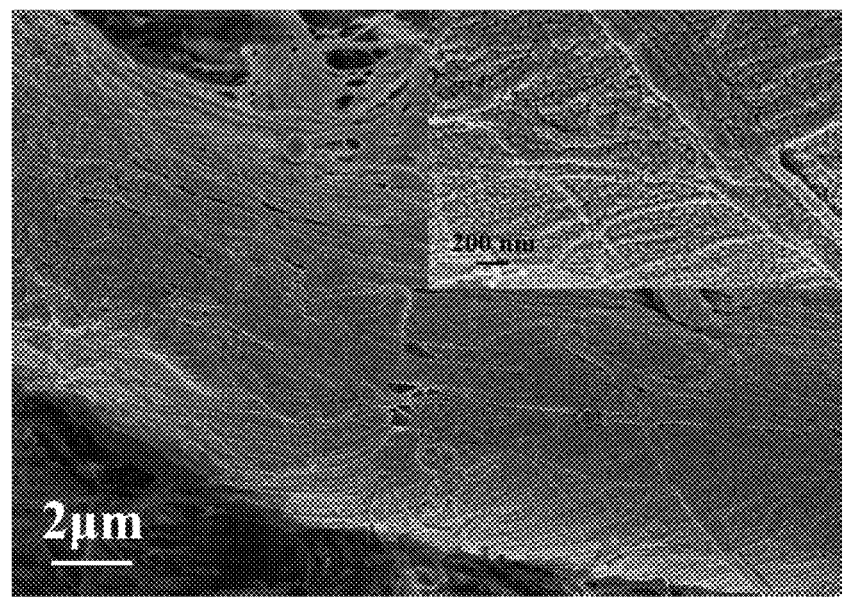
FIG. 1a is a scanning electron microscope (SEM) image of a flexible paper-based surface-enhanced Raman scattering (SERS) substrate prepared in Example 1 of the invention.
Figure 1B:
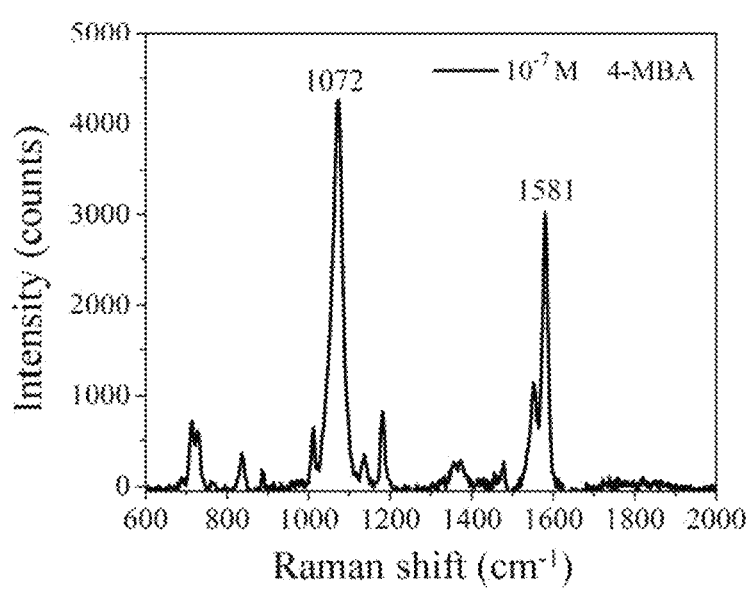
FIG. 1b is a SERS spectrum showing the detection of a $10^{-7}$ mol/L 4-mercaptobenzoic acid (4-MBA) solution using the flexible SERS substrate prepared in Example 1 of the invention.

FIG. 1a is a scanning electron microscope (SEM) image of a flexible paper-based SERS substrate prepared in Example 1 of the invention, from which it can be clearly seen that silver nanoparticles are evenly distributed on the fiber paper. FIG. 1b is a SERS spectrum showing the detection of a $10^{-7}$ mol/L 4-mercaptobenzoic acid (4-MBA) solution using the flexible SERS substrate prepared in Example 1, in which characteristic Raman scattering peaks of 4-MBA are clearly observed.

Figure 2:
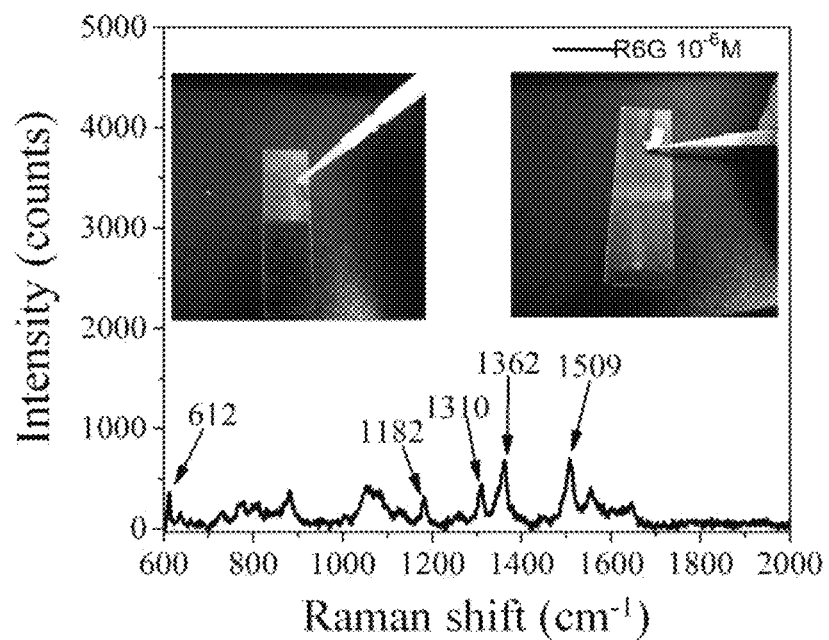
FIG. 2 is a SERS spectrum showing the detection of trace rhodamine 6G (R6G) solid residue using a flexible SERS substrate prepared in Example 2 of the invention, where a $10^{-6}$ mol/L R6G solution is dropped on a clean glass slide, and the glass slide is dried in ambient air and wiped with the pre-moistened flexible SERS substrate, and then the flexible SERS substrate is transferred to a portable Raman spectrometer for analysis.

FIG. 2 is a Raman spectrum showing the detection of trace rhodamine 6G (R6G) using a flexible SERS substrate prepared in Example 2 of the invention, where a $10^{-6}$ mol/L R6G solution is dropped on a clean glass slide, dried and wiped with the pre-moistened flexible SERS substrate; and then the flexible SERS substrate is transferred to a Raman spectrometer for analysis. In the spectrum, characteristic Raman scattering peaks of R6G are marked with corresponding wave number such as 1362 cm$^{-1}$ and 1509 cm$^{-1}$.

Figure 3:
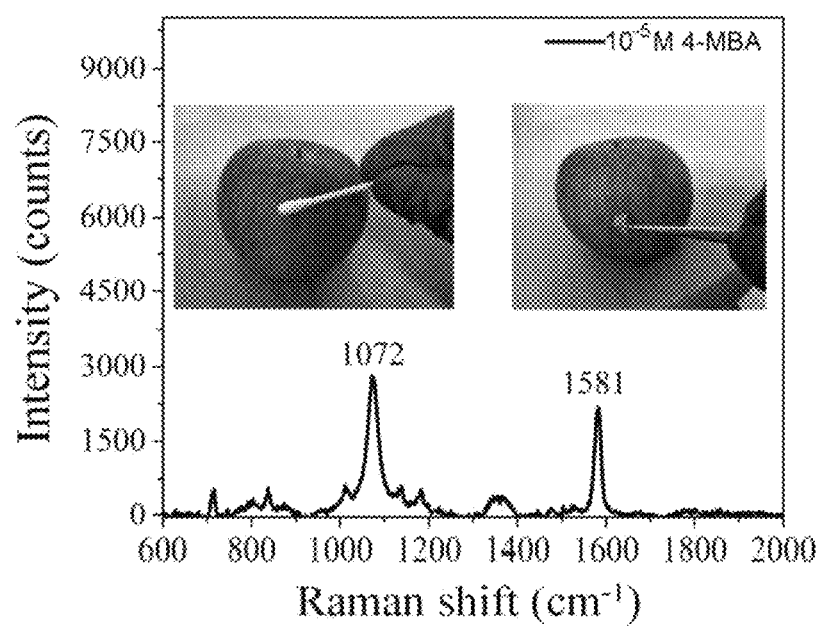
FIG. 3 is a SERS spectrum showing the detection of trace 4-mercaptobenzoic acid (4-MBA) using a flexible SERS substrate prepared in Example 3 of the invention, where the surface of a cleaned apple is smeared with a $10^{-5}$ mol/L 4-MBA solution, dried and wiped with the flexible SRES substrate, and then the SRES substrate is subjected to Raman spectroscopic measurement.

FIG. 3 is a SERS spectrum showing the detection of trace 4-MBA using a flexible SERS substrate prepared in Example 3 of the invention, where a surface of a cleaned apple is smeared with a $10^{-5}$ mol/L 4-MBA solution, dried and wiped with the flexible SERS substrate, and then the SERS substrate is subjected to Raman spectroscopic measurement. In the SERS spectrum, the solid line represents the test result of the flexible SERS substrate after wiping 4-MBA. As we can see, the flexible SERS substrate proves to have good performance in the trace detection of residual organics on the curved surfaces.

Example 1

(1) A filter paper, an absorbent paper or a printing paper, was flatly fixed on a holder of an electron beam evaporation deposition system.

(2) High-purity silver was employed as target material, and a reaction chamber of the electron beam evaporation deposition system was vacuumized at room temperature to 1×10−4 Pa.

(3) An angle between a normal direction of the holder and an incident direction of an evaporated beam was adjusted to 86°, and the holder rotated at 2 rpm, thereby depositing a film of silver nanoparticles on the fiber paper by oblique-angle deposition to produce the SERS substrate, where the film of silver nanoparticles had a thickness according to a crystal oscillator parameter of 700 nm.

(4) A $10^{-7}$ mol/L 4-MBA solution was prepared.

(5) The SERS substrate prepared through steps 1-3 was dipped into the 4-MBA solution prepared in step (4) and then transferred for use.

(6) The SERS substrate after absorbing 4-MBA solution in step (5) was analyzed by Raman spectrometer in which 785 nm laser was used.

FIG. 1a was a scanning electron microscope (SEM) image clearly showing the fiber paper deposited with the film of silver nanoparticles. The Raman spectroscopic detection results of the $10^{-7}$ mol/L 4-MBA solution were shown in FIG. 1b, in which the characteristic Raman scattering peaks of 4-MBA were clearly observed.

Example 2

(1) A filter paper, an absorbent paper or a printing paper was flatly fixed on a holder of an electron beam evaporation deposition system.

(2) High-purity silver was chosen as target material, and a reaction chamber of the electron beam evaporation deposition system was vacuumized at the ambient temperature to $3 \times 10^{-4}$ Pa.

(3) An angle between a normal direction of the holder and an incident direction of an evaporated beam was adjusted to 85°, and the holder rotated at 10 rpm, thereby depositing a film of silver nanoparticles on the fiber paper by oblique-angle deposition to produce the SERS substrate, where the film of silver nanoparticles had a thickness according to a crystal oscillator parameter of 1000 nm.

(4) A $10^{-6}$ mol/L R6G solution was prepared.

(5) 20 μL of the R6G solution prepared in step (4) was dropwise added on a clean glass slide and dried naturally.

(6) The SERS substrate prepared through steps 1-3 was moistened with deionized water, and then wiped the trace R6G residual in step (5).

(7) The SERS substrate after wiping the trace R6G residual in step (6) was analyzed by Raman spectrometer using 785 nm laser.

FIG. 2 was the SERS spectrum showing the detection of trace R6G using the flexible SERS substrate by dropwise adding and wiping, in which characteristic Raman scattering peaks of R6G were clearly observed, proving that the SERS substrate prepared herein well realized the detection of the R6G residue solid.

Example 3

(1) A filter paper, an absorbent paper or a printing paper was flatly fixed on a holder of an electron beam evaporation deposition system.

(2) High-purity silver was chosen as target material, and a reaction chamber of the electron beam evaporation deposition system was vacuumized at the ambient temperature to $1\times10^{-4}$ Pa.

(3) An angle between a normal direction of the hold and an incident direction of an evaporated beam was adjusted to 87°, and the holder rotated at 2 rpm, thereby depositing a film of silver nanoparticles on the fiber paper by oblique-angle deposition to produce the SERS substrate, where the film of silver nanoparticles had a thickness according to a crystal oscillator parameter of 1,300 nm.

(4) A $10^{-5}$ mol/L 4-MBA solution was prepared.

(5) A trace amount of the 4-MBA solution prepared in step (4) was smeared to surfaces of a clean apple and dried.

(6) The SERS substrate prepared through steps 1-3 was moistened with absolute ethanol, and then wiped the trace 4-MBA in step (5).

(7) The SERS substrate after wiping the trace 4-MBA in step (6) was analyzed by Raman spectrometer in which 785 nm laser was used.

FIG. 3 showed the Raman spectroscopic detection results of the trace 4-MBA, in which the characteristic Raman scattering peaks of 4-MBA were clearly observed, proving that trace 4-MBA remained on apple surfaces after the drying treatment. The residues on curved surfaces can be rapidly and effectively detected after wiped with the flexible SERS substrate.

The technical solutions of this invention are illustrated in detail above with reference to the embodiments. Obviously, these embodiments are not intended to limit the invention. Any changes and replacements made by those skilled in the art without departing from the spirit of the invention should fall within the scope of the invention.

What is claimed is:

1. A method of preparing the flexible paper-based surface-enhanced Raman scattering substrate, comprising:
    fixing a fiber paper flatly on a holder of an electron beam evaporation deposition system at room temperature;
    choosing silver as target material, and vacuumizing a reaction chamber of the electron beam evaporation deposition system to $3\times10^{-5}$–$3\times10^{-4}$ Pa;
    adjusting an angle between a normal direction of the holder and an incident direction of an evaporated beam to 85-88°;
    depositing the silver on the fiber paper by electron beam evaporation oblique-angle deposition while rotating the fiber paper at 2-10 rpm to deposit a layer of silver nanoparticles that is tightly bound to the fiber paper; wherein the layer of silver nanoparticles has a thickness corresponding to a crystal oscillator parameter range of 500-1,300 nm.

2. The method of claim 1, wherein the fiber paper is filter paper, absorbent paper or printing paper.

* * * * *